United States Patent
Venezia et al.

(10) Patent No.: US 7,948,018 B2
(45) Date of Patent: May 24, 2011

(54) MULTILAYER IMAGE SENSOR STRUCTURE FOR REDUCING CROSSTALK

(75) Inventors: Vincent Venezia, Sunnyvale, CA (US); Hidetoshi Nozaki, Sunnyvale, CA (US); Duli Mao, Sunnyvale, CA (US); Yin Qian, Milpitas, CA (US); Hsin-Chih Tai, Cupertino, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 211 days.

(21) Appl. No.: 12/109,134

(22) Filed: Apr. 24, 2008

(65) Prior Publication Data

US 2009/0267070 A1    Oct. 29, 2009

(51) Int. Cl.
   *H01L 31/062* (2006.01)
(52) U.S. Cl. .................. 257/294; 257/E27.133
(58) Field of Classification Search ............ 257/E27.133, 257/E27.134, 291, 292, 294
See application file for complete search history.

(56) References Cited

U.S. PATENT DOCUMENTS

| | | | | |
|---|---|---|---|---|
| 5,859,462 | A * | 1/1999 | Tredwell et al. | 257/443 |
| 6,163,030 | A * | 12/2000 | Johnson et al. | 250/370.14 |
| 6,667,468 | B2 * | 12/2003 | Kurosawa et al. | 250/208.1 |
| 2006/0043511 | A1 | 3/2006 | Nomura et al. | |
| 2006/0163618 | A1 | 7/2006 | Park | |
| 2007/0069315 | A1 * | 3/2007 | Stevens et al. | 257/431 |
| 2007/0108487 | A1 * | 5/2007 | Inoue et al. | 257/292 |
| 2007/0284679 | A1 * | 12/2007 | Ohtsuka et al. | 257/414 |
| 2008/0224190 | A1 | 9/2008 | Lee et al. | |

* cited by examiner

*Primary Examiner* — Ha Tran T Nguyen
*Assistant Examiner* — Vongsavanh Sengdara
(74) *Attorney, Agent, or Firm* — Blakely Sokoloff Taylor & Zafman LLP

(57) ABSTRACT

An image sensor pixel includes a substrate, an epitaxial layer, and a light collection region. The substrate is doped to have a first conductivity type. The epitaxial layer is disposed over the substrate and doped to have a second conductivity type opposite of the first conductivity type. The light collection region is disposed within the epitaxial layer for collecting photo-generated charge carriers. The light collection region is doped to have the first conductivity type as well.

11 Claims, 7 Drawing Sheets

MULTILAYER IMAGE SENSOR STRUCTURE FOR REDUCING CROSSTALK

TECHNICAL FIELD

This disclosure relates generally to image sensors, and in particular but not exclusively, relates to CMOS image sensors.

BACKGROUND INFORMATION

Image sensors have become ubiquitous. They are widely used in digital still cameras, cellular phones, security cameras, as well as, medical, automobile, and other applications. The technology used to manufacture image sensors, and in particular, complementary metal-oxide-semiconductor ("CMOS") image sensors ("CIS"), has continued to advance at great pace. For example, the demands of higher resolution and lower power consumption have encouraged the further miniaturization and integration of these image sensors.

FIG. 1 illustrates a conventional front side illuminated CIS 100. The front side of CIS 100 is the side of substrate 105 upon which the pixel circuitry is disposed and over which metal stack 110 for redistributing signals is formed. The metal layers (e.g., metal layer M1 and M2) are patterned in such a manner as to create an optical passage through which light incident on the front side CIS 100 can reach the photosensitive or photodiode ("PD") region 115. To implement a color CIS, the front side further includes a color filter layer 120 disposed under a microlens 125. Microlens 125 aids in focusing the light onto PD region 115.

CIS 100 includes pixel circuitry 130 disposed adjacent to PD region 115 within a P doped well. Pixel circuitry 130 provides a variety of functionality for regular operation of CIS 100. For example, pixel circuitry 130 may include circuitry to commence acquisition of an image charge within PD region 115, to reset the image charge accumulated within PD region 115 to ready CIS 100 for the next image, or to transfer out the image data acquired by CIS 100.

FIG. 2 illustrates two neighboring CIS pixels 100 formed within a P-epitaxial ("epi") layer 140 disposed over a P+ substrate 105. When a photo-generated charge carrier is formed shallow within a pixel (e.g., charge carrier 150), it experiences a strong upward attractive force (shown by the arrows) towards PD region 115, due to the depletion region or P-N junction between the PD and the surrounding epitaxial layer. When a photo-generated charge carrier is formed deeper within a pixel (e.g., charge carrier 155), it initially experiences a weaker upward repulsive force due to the dopant gradient at the junction between the P– epi layer 140 and the P+ substrate 105.

Crosstalk is a serious problem in image sensors. There are three components to crosstalk: a) electrical crosstalk, b) optical crosstalk, and c) spectral crosstalk. Spectral crosstalk is caused by the diffraction and/or scattering of light off of metal lines and at interfaces between the dielectric layers within metal stack 110. Spectral crosstalk results from the finite (nonzero) transmittance of color filter 120 to wavelengths outside its target pass band, such as the finite transmittance of green and blue wavelengths through a red filter.

One form of electrical crosstalk is lateral drift of photo-generated charge carriers created deep in the semiconductor epitaxial layers (e.g., charge carrier 155). As these photo-generated charge carriers rise, they can drift laterally and end up collected in the PD region of a neighboring pixel. Blooming is another form of electrical crosstalk characterized by the lateral diffusion of charge carriers when a PD region becomes full or saturated with charge carriers. Blooming is most commonly experienced in high luminous environments. Photo carriers that are generated near a saturated PD region 115 will not be collected and therefore remain free to diffuse laterally into a neighboring pixel. Blooming results in the blurring of edges in still images and streaking in moving images. Both forms of electrical crosstalk are due to charge carriers generated in one pixel being collected by a neighboring pixel.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and method of fabrication of an image sensor array having improved electrical crosstalk characteristics are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 3:
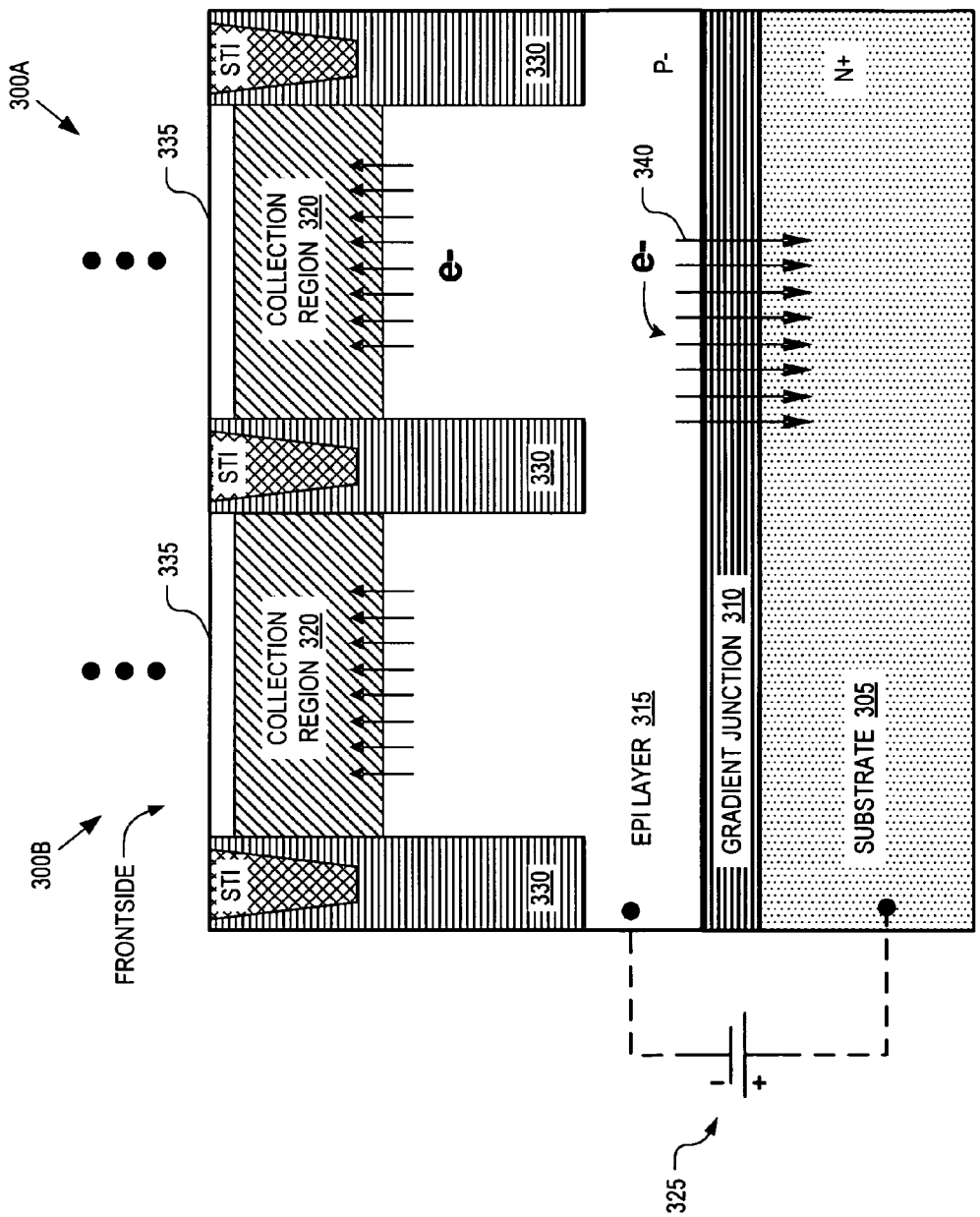
FIG. 3 is a cross sectional view of two neighboring image sensors having a structure that reduces electrical crosstalk, in accordance with an embodiment of the invention.

FIG. 3 is a cross sectional view of two neighboring image sensors 300A and 300B (collectively image sensors 300) having a multilayer structure that reduces electrical crosstalk, in accordance with an embodiment of the invention. The illustrated embodiment of image sensors 300 include a substrate 305, a gradient junction 310, an epitaxial ("epi") layer 315, collection regions 320, and a biasing circuit 325. The collection regions 320 of each image sensor 300 are isolated from each other with shallow trench isolations ("STI") and dopant wells 330. In the illustrated embodiment, a pinning layer 335 (e.g., P type pinning) overlays collection regions 320 to passivate their surfaces.

Figure 1:
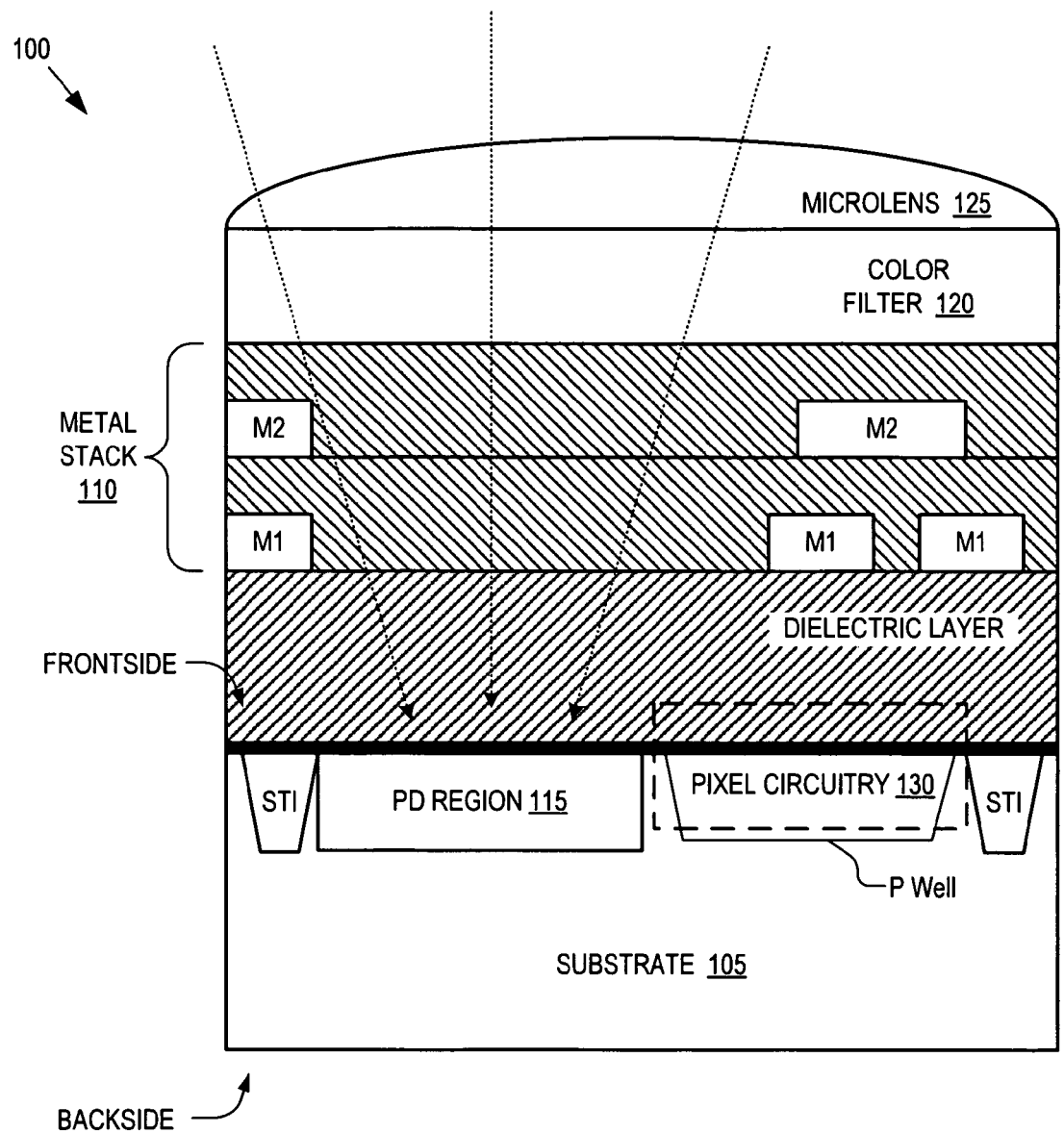
FIG. 1 is a cross sectional view of a conventional front side illuminated CMOS image sensor.
Figure 2:
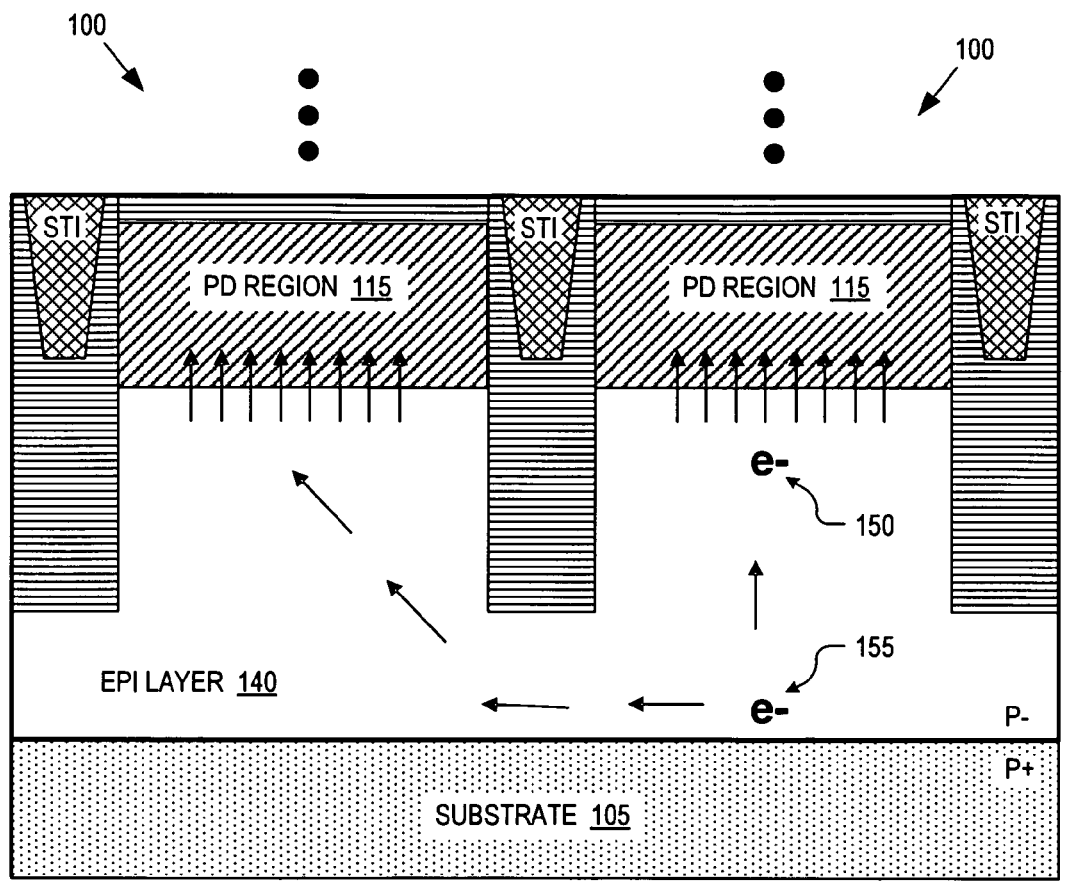
FIG. 2 is a cross sectional view of two neighboring CMOS image sensors illustrating electrical crosstalk.

Although not illustrated, it should be appreciated that image sensors 300 may include a number of material layers disposed on the front side, such as those illustrated in FIG. 1 (e.g., pixel circuitry 130, a dielectric layer, metal stack 110, color filter 120, microlens 125, etc.), as well as other conventional layers used for fabricating CMOS (complementary metal-oxide-semiconductor) image sensors ("CIS") (e.g., antireflective films, etc.). Furthermore, the illustrated cross section of image sensors 300 does not illustrate the pixel circuitry of each sensor. However, it should be appreciated that each image sensor 300 includes pixel circuitry (for example see FIG. 7) coupled to its collection region 320 for performing a variety of functions, such as commencing image acquisition, resetting accumulated image charge, transferring out acquired image data, or otherwise.

In the illustrated embodiment, substrate 305 is a silicon substrate highly doped with N type dopants (e.g., Arsenic, As; Phosphorous, P) while epi layer 315 is a silicon layer lightly doped with P type dopants (e.g., Boron, B). Collection regions 320 represent photosensitive regions (e.g., photodiode), which are doped with the same conductivity type as substrate 305. The illustrated dopant wells 330 are P wells for isolating adjacent collection regions 320 and prevent direct interface between the STI and collection regions 320. However, it should be appreciated that the conductivity types of all the elements can be swapped such that substrate 305 is P+ doped, epi layer 315 is N-doped, collection regions 320 are P+ doped, and dopant wells 330 are N doped.

One technique for reducing electrical crosstalk is to use a P− epi layer over an N type substrate. N type substrates may include silicon wafers doped with high concentrations of Arsenic or Phosphorous (also referred to as N+ substrates). Since standard CIS typically use P type epitaxial layers (e.g., P− epi layer 315), when using N+ substrates, the P type epi layer 315 may be fabricated by growing the P type epi layer on the N+ substrate. The electric field 340 formed at the interface between P− epi layer 315 and N+ substrate 305 acts as a barrier to photo generated charge carriers (e.g., photo electrons) that are formed in N+ substrate 305. This barrier lowers the probability that a charge carrier formed deep in the CIS structure can diffuse to an adjacent collection region 320. Similarly, this structure reduces blooming. Electrons that are uncollected by a full collection region 320 are drawn into N+ substrate 305 by electric field 340, rather than diffusing down around dopant wells 330 and into a neighboring collection region 320.

The junction between the P− epi layer 315 and N+ substrate 305 is not infinitely abrupt. The N+ substrate is typically heavily doped with As or P. During the epitaxial growth, which is typically done at high temperatures (>800 C), N type dopants diffuse into P− epi layer 315. In addition, thermal processing associated with CIS fabrication increase the N type dopant diffusion into epi layer 315. As such, the junction between substrate 305 and epi layer 315 is graded (illustrated as gradient junction 310). Electric field 340, and therefore the field barrier generated to reduce crosstalk and blooming, is dependent on the diffusion gradient profile. The final thickness of epi layer 315 after diffusion is thus dependent on the diffusion gradient profile. Since epi layer 315 houses collection regions 320, the light collection efficiency and the degree of lateral charge carrier diffusion and blooming will vary with the CIS process thermal budget and the epitaxial layer growth process.

During operation, photo-generated charge carriers that are created shallow within epi layer 315 are collected by the electric field generated by the depletion region at the P-N junction between collection region 320 and epi layer 315. In contrast, photo-generated charge carriers that are created deep within epi layer 315 have a statistically increased chance of being drawn into substrate 305 by electric field 340 where they recombine without contributing to crosstalk. Similarly, photo-generated charge carriers that are created even deeper within substrate 305 are inhibited from diffusing up into a neighboring collection region 320 by the potential barrier created by field 340. Finally, in one embodiment, substrate 305 can be positively biased relative to epi layer 315 and collection regions 320 by biasing circuit 325. The presence of the biasing operates to further impede photo-electrons from crossing the potential barrier of field 340. It should be appreciated that in an embodiment where substrate 305 is a P+ substrate and epi layer 315 is an N− epi layer, the biasing circuit 325 would negatively bias substrate 305 relative to epi layer 315.

Figure 4:
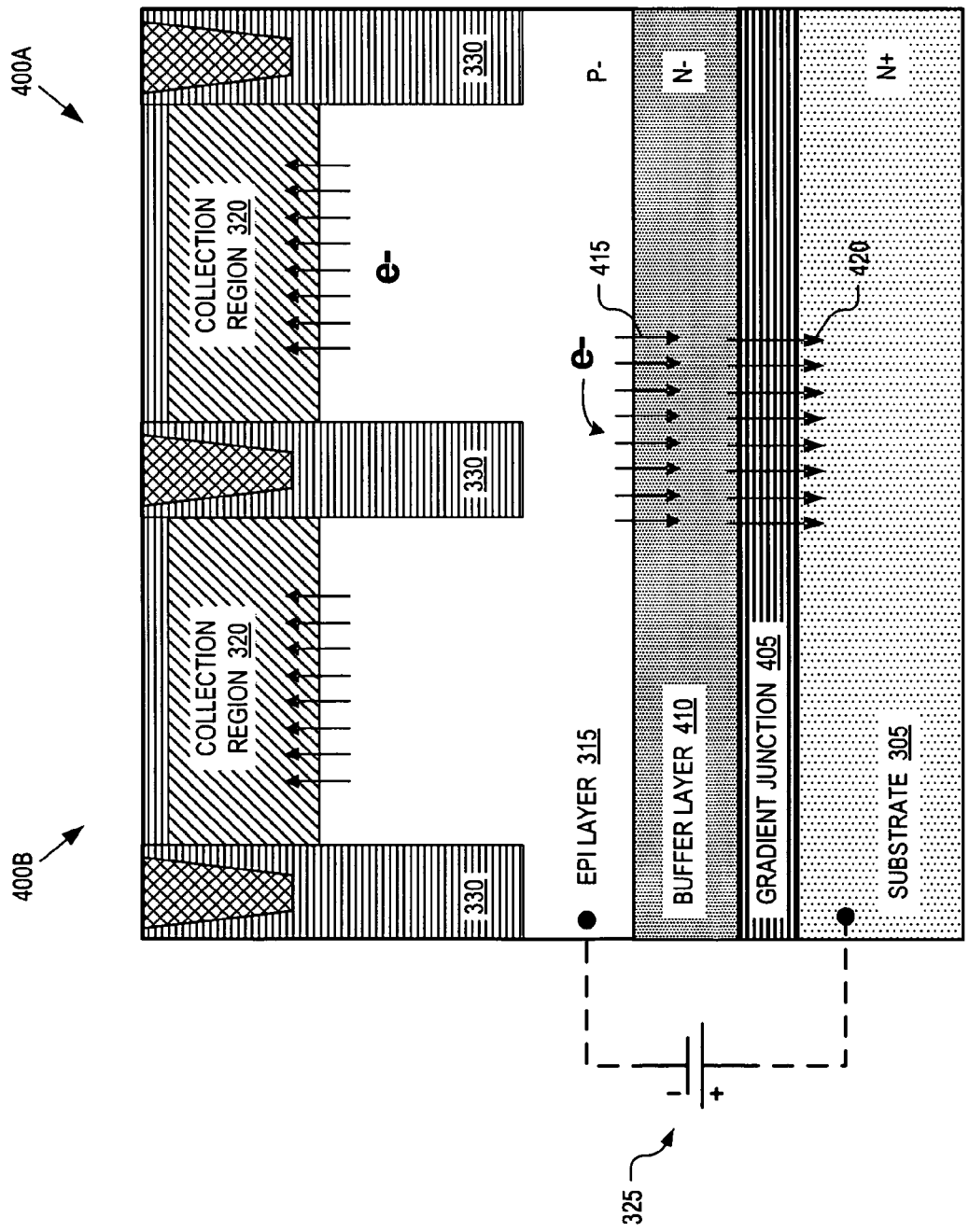
FIG. 4 is a cross sectional view of two neighboring image sensors having a structure that reduces electrical crosstalk, in accordance with an embodiment of the invention.

FIG. 4 is a cross sectional view of two neighboring image sensors 400A and 400B (collectively image sensors 400) having a multilayer structure that reduces electrical crosstalk, in accordance with an embodiment of the invention. Image sensors 400 are similar to image sensors 300 with the following exceptions. Image sensors 400 include an additional buffer layer 405 having the same conductivity type doping as substrate 305, but in a lesser concentration (e.g., N− buffer layer 405 and N+ substrate 305). Since the N type dopant concentration interface is not infinitely abrupt, gradient junction 405 represents a graded dopant profile from the N+ substrate 305 to the N− buffer layer 410. In one embodiment, image sensors 400 may also include biasing circuit 325 to bias substrate 305 relative to collection regions 320 and epi layer 315 (e.g., positive for N type substrate and collection regions or negatively for a P type substrate and collection regions).

The depletion region formed at the interface of the N− buffer layer 410 and the P− epi layer 315 generates an electric field 415, which draws deep photo-electrons into buffer layer 410 where they can recombine. A dopant gradient field 420 is generated at the gradient junction 405, which also pulls photo-electrons generated in buffer layer 410 into substrate 305 or impedes the diffusion of photo-electrons generated in substrate 305 from migrating into buffer layer 410 and from there into epi layer 315.

Similar to epi layer 315, buffer layer 410 is an epitaxial layer grown over substrate 305 and serves a dual purpose. First, buffer layer 410 traps deep or excess photo-electrons resulting in a reduction in crosstalk and blooming. Second, buffer layer 410 serves as a N type diffusion buffer, preventing the high concentration N type dopants of substrate 305 from diffusing into the P type epi layer 315 during epitaxial growth cycles and the other high temperature CIS processes. The dopant concentration in buffer layer 410 is significantly lower than substrate 305, resulting in significantly less N type dopant diffusion into the P type epi layer 315. As such, buffer layer 410 can increase the thermal budget of image sensors 400 during fabrication. Buffer layer 410 adds process margin to device fabricated on N+ substrates, which eases process development and process transfers. In addition, this multilayer structure is less dependent on a particular wafer vendor's growth conditions, allowing wider sources of starting material.

The lower thickness limit to buffer layer 410 is determined by the amount of dopant diffusion expected from substrate 305. However, the upper limit to the thickness of buffer layer 410 is not limited by the fabrication process. Photo-electrons present in buffer layer 410 will more easily diffuse to substrate 305 than cross the P-N junction barrier of field 415.

Therefore a wide margin can be used in choosing the thickness of buffer layer 410. For example, buffer layer 410 may range between 0.3 µm and 10 µm.

Figure 5:
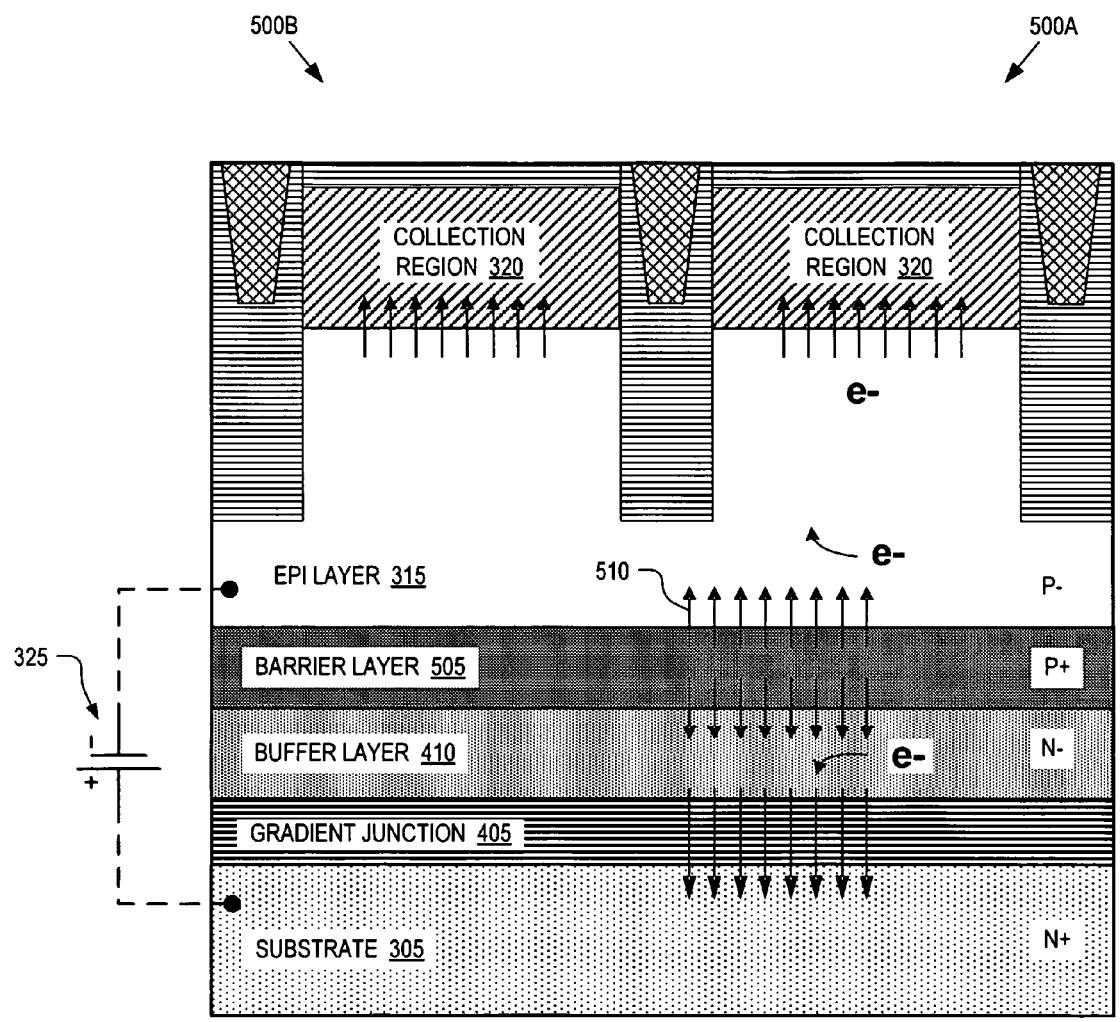
FIG. 5 is a cross sectional view of two neighboring image sensors having a structure that reduces electrical crosstalk, in accordance with an embodiment of the invention.

FIG. 5 is a cross sectional view of two neighboring image sensors 500A and 500B (collectively image sensors 500) having a multilayer structure that reduces electrical crosstalk, in accordance with an embodiment of the invention. Image sensors 500 are similar to image sensors 400 with the following exceptions. Image sensors 500 include a barrier layer 505 disposed between epi layer 315 and buffer layer 410. Barrier layer 505 has the same conductivity type as epi layer 315 (e.g., P type), but with a greater dopant concentration than epi layer 315. In an alternative embodiment, image sensors 500 include barrier layer 505, but lack buffer layer 410.

Barrier layer 505 serves two purposes. On the device side, barrier layer 505 creates an electric field 510 that drives photo-electrons present in epi layer 315 up towards collection regions 320. On the substrate side, barrier layer 505 increases the potential barrier that photo-electrons in buffer layer 410 must overcome to diffuse into epi layer 315. Accordingly, barrier layer 505 impedes deep photo-electrons from migrating into a neighboring collection region 320 while promoting the collection of shallow photo-electrons by pushing them up. The size of the potential barrier is dependent upon the dopant concentrations of buffer layer 410 and barrier layer 505. Barrier layer 505 may be doped via ion implantation or controlling epitaxial growth conditions. Of course, in one embodiment, image sensors 500 may also include biasing circuit 325 to bias substrate 305 relative to collection regions 320 and epi layer 315 (e.g., positive for N type substrate and N type collection regions or negatively for a P type substrate and P type collection regions).

Figure 6:
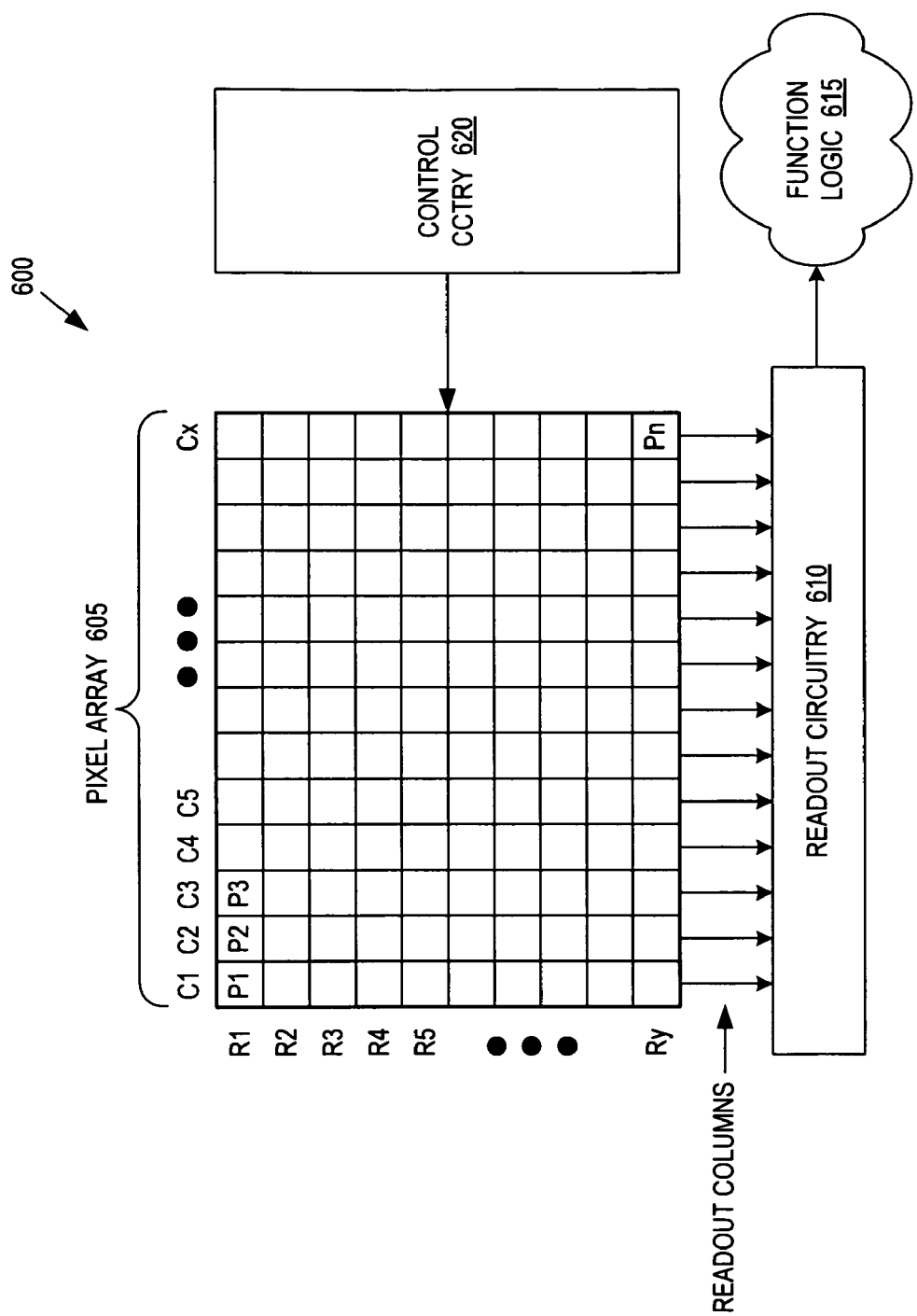
FIG. 6 is a block diagram illustrating an imaging system, in accordance with an embodiment of the invention.

FIG. 6 is a block diagram illustrating an imaging system 600, in accordance with an embodiment of the invention. The illustrated embodiment of imaging system 600 includes an image sensor array 605 having improved electrical crosstalk characteristics, readout circuitry 610, function logic 615, and control circuitry 620.

Image sensor array 605 is a two-dimensional ("2D") array of image sensors or pixels (e.g., pixels P1, P2 . . . , Pn). In one embodiment, each pixel represents any of image sensors 300, 400, or 500. In one embodiment, each pixel is a complementary metal-oxide-semiconductor ("CMOS") image sensor. In one embodiment, image sensor array 605 is a color filter array including a color pattern (e.g., Bayer pattern or mosaic) of red, green, and blue filters. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 610 and transferred to function logic 615. Readout circuitry 610 may include amplification circuitry, analog-to-digital ("ADC") conversion circuitry, or otherwise. Function logic 615 may simply store the image data or even manipulate the image data by applying post image effects (e.g., crop, rotate, remove red eye, adjust brightness, adjust contrast, or otherwise). In one embodiment, readout circuitry 610 may readout a row of image data at a time along readout column lines (illustrated) or may readout the image data using a variety of other techniques (not illustrated), such as a column/row readout, a serial readout, or a full parallel readout of all pixels simultaneously.

Control circuitry 620 is coupled to image sensor array 605 to control operational characteristic of image sensor array 605. For example, control circuitry 620 may generate a shutter signal for controlling image acquisition. In one embodiment, the shutter signal is a global shutter signal for simultaneously enabling all pixels within image sensor array 605 to simultaneously capture their respective image data during a single acquisition window. In an alternative embodiment, the shutter signal is a rolling shutter signal whereby each row, column, or group of pixels is sequentially enabled during consecutive acquisition windows.

Figure 7:
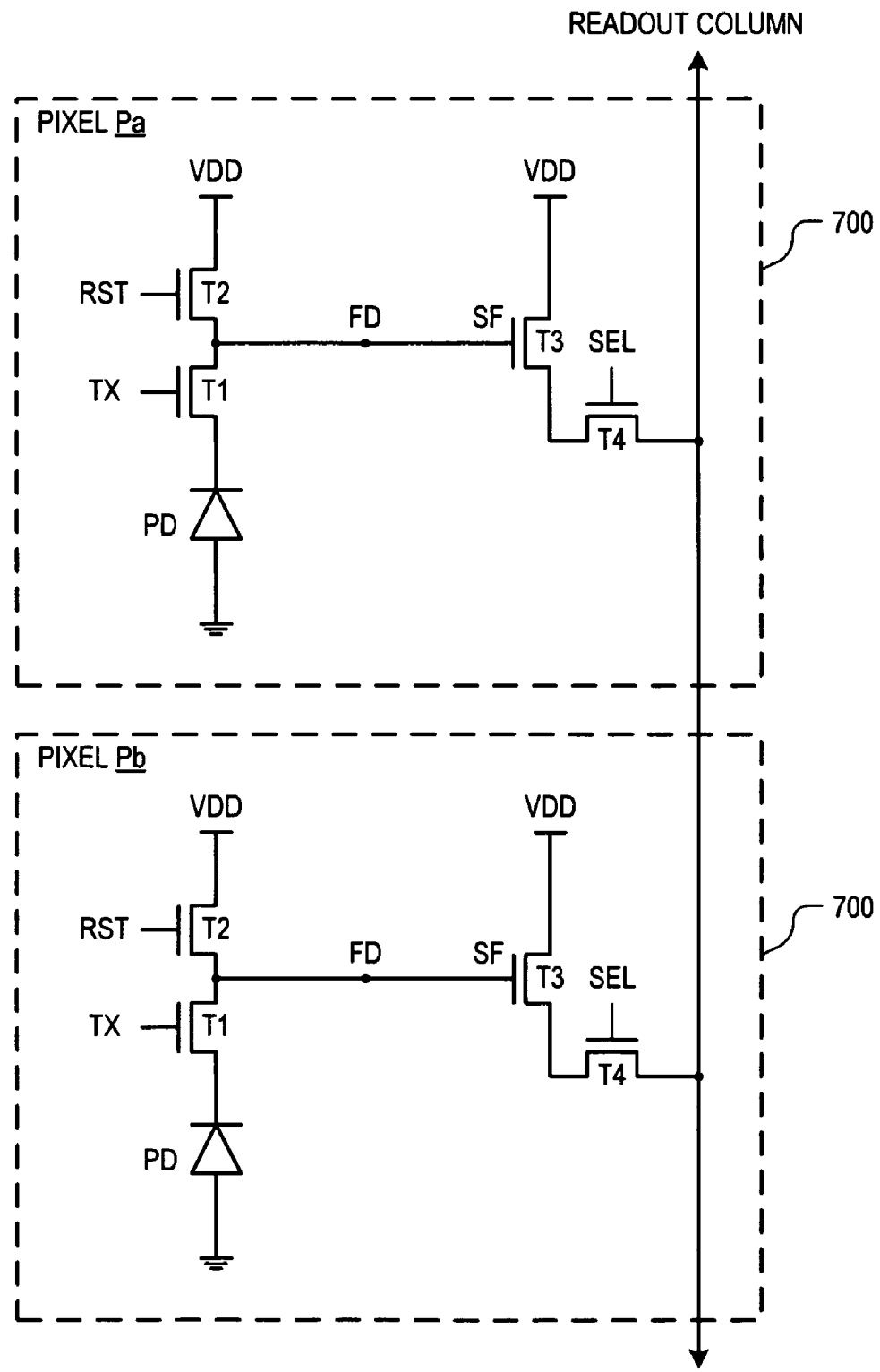
FIG. 7 is a circuit diagram illustrating sample pixel circuitry of two pixels within an image sensor array, in accordance with an embodiment of the invention.

FIG. 7 is a circuit diagram illustrating pixel circuitry 700 of two four-transistor ("4T") pixels within an image sensor array, in accordance with an embodiment of the invention. Pixel circuitry 700 is one possible pixel circuitry architecture for implementing each pixel within image sensor array 605 of FIG. 6. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 7, pixels Pa and Pb are arranged in two rows and one column. The illustrated embodiment of each pixel circuitry 700 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges.

Reset transistor T2 is coupled between a power rail VDD and the floating diffusion node FD to reset the pixel (e.g., discharge or charge the FD and the PD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance connection to the floating diffusion FD. Finally, select transistor T4 selectively couples the output of pixel circuitry 700 to the readout column line under control of a select signal SEL.

In one embodiment, the TX signal, the RST signal, and the SEL signal are generated by control circuitry 620. In an embodiment where image sensor array 605 operates with a global shutter, the global shutter signal is coupled to the gate of each transfer transistor T1 in the entire image sensor array 605 to simultaneously commence charge transfer from each pixel's photodiode PD. Alternatively, rolling shutter signals may be applied to groups of transfer transistors T1.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:
1. An image sensor pixel, comprising:
a substrate doped to have a first conductivity type;

an epitaxial layer disposed over the substrate and doped to have a second conductivity type opposite of the first conductivity type;

a light collection region for collecting photo-generated charge carriers disposed within the epitaxial layer, wherein the light collection region is doped to have the first conductivity type, wherein the light collection region is defined to be a doped region having only the first conductivity type;

a buffer layer disposed between the epitaxial layer and the substrate, the buffer layer doped to have the first conductivity type; and a barrier layer disposed between the epitaxial layer and the buffer layer, the barrier layer doped to have the second conductivity type, the barrier layer having a higher dopant concentration than the epitaxial layer, wherein the buffer layer impedes diffusion of dopants of the first conductivity type from the substrate into the epitaxial layer, wherein the barrier layer generates an electric field that pushes charge carriers generated in the epitaxial layer towards the light collection region while impeding charge carriers generated in the buffer layer or the substrate from entering the epitaxial layer.

2. The image sensor pixel of claim 1, wherein the buffer layer has a lower dopant concentration than the substrate.

3. The image sensor pixel of claim 2, wherein the buffer layer is between 0.3 µm and 10 µm thick.

4. The image sensor pixel of claim 1, wherein the first conductivity type includes N type dopants and the second conductivity type includes P type dopants.

5. The image sensor pixel of claim 1, wherein the image sensor pixel comprises a front side illuminated complementary metal-oxide-semiconductor ("CMOS") image sensor.

6. The image sensor pixel of claim 5, wherein the light collection region comprises a photo-diode, the image sensor pixel further comprising:

a metal stack including metal layers for routing signals over the front side of the CMOS image sensor separated by dielectric layers; and a microlens disposed on the metal stack, the microlens for focusing light onto the light collection region through the metal stack.

7. The image sensor pixel of claim 1, further comprising a biasing circuit coupled to bias the substrate positively relative to the epitaxial layer.

8. An imaging system, comprising:

a complementary metal-oxide-semiconductor ("CMOS") array of image sensors disposed on a substrate doped to have a first conductivity type, wherein each image sensor includes:

an epitaxial layer disposed over the substrate and doped to have a second conductivity type opposite of the first conductivity type;

a light collection region for collecting photo-generated charge carriers disposed within the epitaxial layer, wherein the light collection region is doped to have the first conductivity type, wherein the light collection region is defined to be a doped region having only the first conductivity type;

a buffer layer disposed between the epitaxial layer and the substrate, the buffer layer doped to have the first conductivity type; and a barrier layer disposed between the epitaxial layer and the buffer layer, the barrier layer doped to have the second conductivity type, the barrier layer having a higher dopant concentration than the epitaxial layer, wherein the buffer layer impedes diffusion of dopants of the first conductivity type from the substrate into the epitaxial layer, wherein the barrier layer generates an electric field that pushes charge carriers generated in the epitaxial layer towards the light collection region while impeding charge carriers generated in the buffer layer or the substrate from entering the epitaxial layer; and readout circuitry coupled to the CMOS array to readout image data from each of the image sensors.

9. The imaging system of claim 8, wherein:

the buffer layer is doped to have a lower dopant concentration of the first conductivity type than the substrate.

10. The imaging system of claim 8, wherein the first conductivity type includes N type dopants and the second conductivity type includes P type dopants.

11. The imaging system of claim 8, further comprising a biasing circuit coupled to bias the substrate positively relative to the epitaxial layer.

* * * * *